United States Patent [19]

Sameshima

[11] Patent Number: 5,270,231
[45] Date of Patent: Dec. 14, 1993

[54] METHOD OF MANUFACTURING DEVICE HAVING FERROELECTRIC FILM

[75] Inventor: Katsumi Sameshima, Kyoto, Japan

[73] Assignee: Rohm Co., Ltd., Kyoto, Japan

[21] Appl. No.: 984,110

[22] Filed: Dec. 1, 1992

[30] Foreign Application Priority Data

Dec. 20, 1991 [JP] Japan .................... 3-338834

[51] Int. Cl.⁵ ............................ H01L 21/70
[52] U.S. Cl. ........................ 437/40; 437/228
[58] Field of Search ............ 437/40, 41, 228, 229

[56] References Cited

U.S. PATENT DOCUMENTS 4,655,874  4/1987  Marks .................... 437/229
5,077,234  12/1991  Scoop et al. ............ 437/229

OTHER PUBLICATIONS

Mark A. Title, et al., "Reactive ion beam etching of PLZT electrooptic substrates with repeated self-aligned masking" Applied Optics, vol. 25, No., May 1, 1986, pp. 1508-1510.

*Primary Examiner*—Tom Thomas
*Attorney, Agent, or Firm*—Steven M. Rabin

[57] ABSTRACT

A device having a ferroelectric film formed on the surface of a semiconductor substrate is manufactured. An oxide film having a window above a channel region is formed on the surface of the semiconductor substrate. The ferroelectric film is formed so as to cover the oxide film and the like. In addition, the surface of the ferroelectric film is flattened by a resist. The resist and the ferroelectric film are then etched back, to expose the oxide film. In this state, an unnecessary portion of the oxide film is selectively removed. If the oxide film is formed into a fine pattern, it is possible to form the ferroelectric film into a fine pattern.

15 Claims, 3 Drawing Sheets

METHOD OF MANUFACTURING DEVICE HAVING FERROELECTRIC FILM

BACKGROUND OF THE INVENTION

1. Field of the Invention

The present invention relates to a method of manufacturing a device having a ferroelectric film, for example, a semiconductor device such as a nonvolatile memory device.

2. Description of the Prior Art

It is known that if an electric field is applied to a ferroelectric material such as PZT (lead(Pb) Zirconate Titanate), there occurs a state where the direction of polarization is aligned in the direction of the electric field, and this state remains after the electric field is removed. That is, the polarization of the ferroelectric material displays hysteresis relative to the application of the electric field. Consequently, it is possible to construct a nonvolatile semiconductor memory device by utilizing such hysteresis.

More specifically, a ferroelectric film is used as a gate insulation film of a field effect transistor. If an electric field is applied to the ferroelectric film to reverse the direction of polarization, the threshold value of the transistor varies between two values. Since the polarization of the ferroelectric film is held even after removing the electric field, information can be written/erased by applying the electric field to reverse the direction of polarization of the ferroelectric film. In addition, information can be read out by examining the threshold value of the transistor. In such a manner, information can be stored in a nonvolatile manner.

When a ferroelectric film is used in a semiconductor integrated circuit, the fine processing of the ferroelectric film is required. In patterning the ferroelectric film, the ferroelectric film is first formed on the surface of a semiconductor substrate, and a resist corresponding to a desired pattern is formed thereon. Then, the ferroelectric film is patterned by ion milling using the resist as a mask. However, in a ferroelectric material such as PZT which is the likeliest to be applied to a memory device, the selection ratio thereof to the resist in the ion milling is as low as 1 to 1.2. Therefore, it is necessary to apply the resist to large thicknesses of 2 to 3 μm.

If the resist is applied thick, however, a resist pattern cannot be made fine, thereby to make it inevitably difficult to perform the fine processing of the ferroelectric film. Moreover, if even a part, which adheres to the surface of the semiconductor substrate, of the ferroelectric film is etched away by the ion milling, the semiconductor substrate is considerably damaged. Consequently, the characteristics of the device is degraded.

The prior art which is a solution to this problem is disclosed in, for example, a document entitled "Reactive ion beam etching of PLZT electrooptic substrates with repeated self-aligned masking" APPLIED OPTICS Vol. 25, No. 9, 1 May 1986, pp. 1508–1510. This document describes the technique for performing the fine processing of a PLZT (lead(Pb) Lanthanum Zirconate Titanate) substrate which is a ferroelectric substance. That is, a chrome thin film is formed on the surface of the PLZT substrate, and a thin resist pattern is formed on the chrome thin film. If dry etching is made using a resist as a mask by ion milling, the chrome thin film in a portion where there is no resist and the PLZT substrate directly thereunder are etched. At this time, the resist is also etched at approximately the same speed as PLZT. The reason for this is that the selection ratio of the resist to the PLZT is low as described above.

The dry etching is stopped in the stage in which etching proceeds to some extent, the resist remaining on the chrome thin film is removed and then, a resist is applied again. The resist is exposed from the back of the substrate (from the opposite side of the surface to which the resist is applied). At this time, the chrome thin film remaining on the surface of the substrate functions as a mask, so that the resist film can be patterned with high precision in a so-called self-alignment manner.

Thereafter, the same operations are repeated. Finally, the chrome thin film is removed, thereby to achieve the fine processing of the PLZT substrate.

However, fine processing performed by repeating the formation of the thin resist pattern and dry etching using the thin resist pattern as a mask is applicable to the processing of the PLZT substrate capable to transmitting light, but is not applicable to the fine processing of a ferroelectric film formed on, for example, the surface of a silicon substrate. That is, in the above-mentioned prior art, the transmittance for light of the PLZT is utilized, so that a thin resist pattern is formed in a self-alignment manner by exposure from the back of the substrate. Consequently, it is possible to form a fine resist pattern with high precision, thereby to make it possible to perform the fine processing of the PLZT substrate.

On the other hand, the exposure from the back of the substrate is not applicable to the processing of the ferroelectric film formed on the surface of the substrate having barrier properties for light such as a silicon substrate. Consequently, the same technique as described above cannot be used so as to perform the processing of the ferroelectric film. That is, even if an attempt to pattern the ferroelectric film by repeating the formation of the thin resist pattern and the dry etching is made, a resist pattern formed by a plurality of times of repetition is unavoidably shifted. Therefore, it is difficult to perform the fine processing of the ferroelectric film.

Moreover, even in the above-mentioned prior art, it is impossible to avoid the problem of damaging the substrate by the ion milling.

SUMMARY OF THE INVENTION

Therefore, an object of the present invention is to provide a method of manufacturing a device having a ferroelectric film, which makes possible the fine processing of the ferroelectric film.

In the present invention, an underlying film, which is made of a material having a low selection ratio to a ferroelectric film in the first type of etching and having a high selection ratio to the above-mentioned ferroelectric film in the second type of etching, having a window in a region where the ferroelectric film is to be formed is patterned on a substrate. The ferroelectric film is then formed so as to cover the surface of the substrate on which the underlying film is formed and then, a resist is formed so as to flatten the surface of the ferroelectric film. Then, the resist and the ferroelectric film are etched back by the above-mentioned first type of etching until the underlying film is exposed. The underlying film is removed by the above-mentioned second type of etching.

According to such a method, if the underlying film is formed into a fine pattern, a ferroelectric film having a fine pattern is formed in the window of the underlying film. Consequently, if the underlying film is removed after the etch back, a ferroelectric film having a fine pattern can be formed on the substrate.

The underlying film is made of a material having a low selection ratio to the ferroelectric film in the first type of etching, and the above-mentioned etch back is made by this first type of etching. Consequently, there is no possibility that the underlying film is previously removed in the case of the etch back, so that the surface of the substrate is not exposed. Therefore, the substrate is prevented from being damaged.

Furthermore, the underlying film is further made of a material having a high selection ratio to the ferroelectric film in the second type of etching. Accordingly, when the underlying film on the surface of the substrate is removed, it is possible to satisfactorily select only this underlying film and remove the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1 (d) to 1 (f) are cross-sectional views showing the steps subsequent to the step shown in FIG. 1 (c); and FIGS. 1 (g) to 1 (i) are cross-sectional views showing the steps subsequent to the step shown in FIG. 2 (f).

DESCRIPTION OF THE PREFERRED EMBODIMENTS

Figure 1:
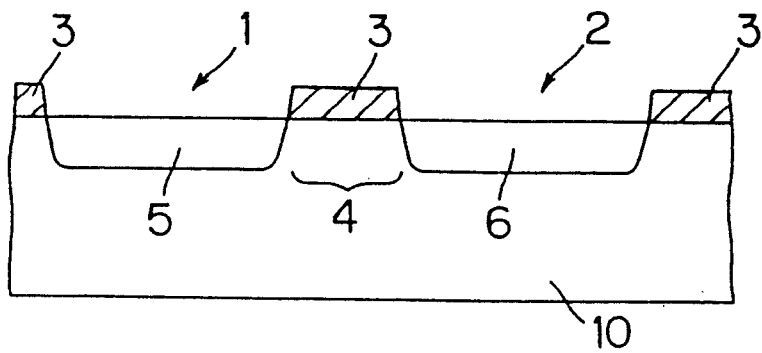
FIGS. 1 (a) to 1 (c) are cross sectional views showing the sequential steps of a method of manufacturing a semiconductor device having a ferroelectric film according to an embodiment of the present invention.
Figure 1:
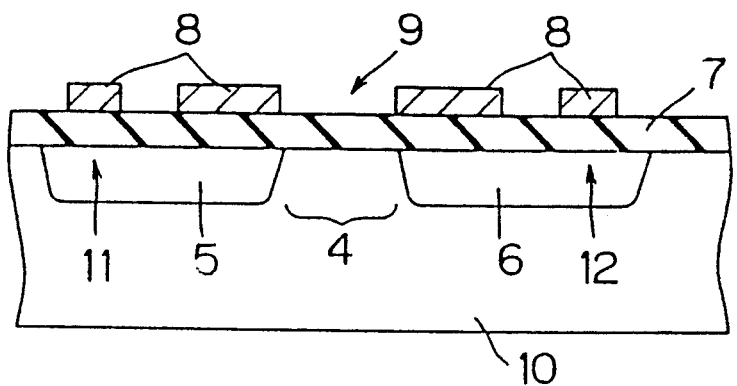
Figure 1:
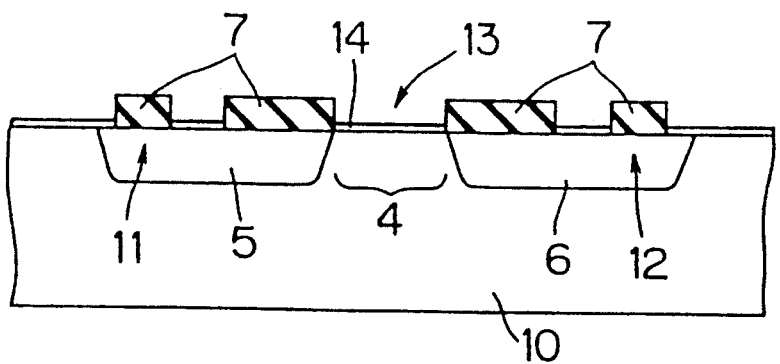
Figure 1:
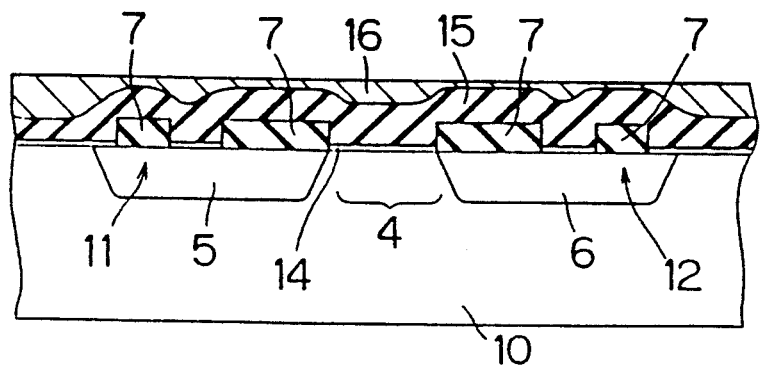
Figure 1:
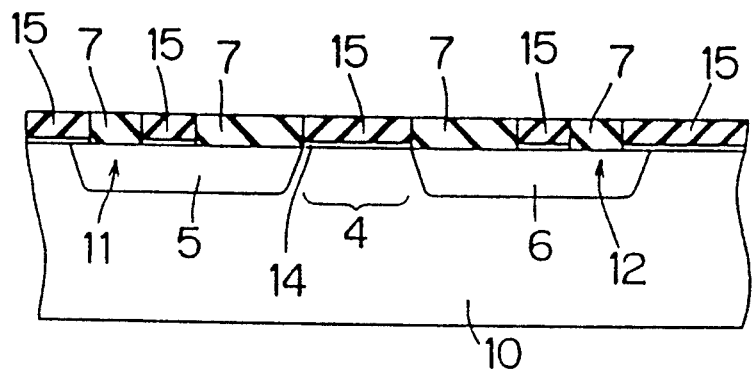
Figure 1:
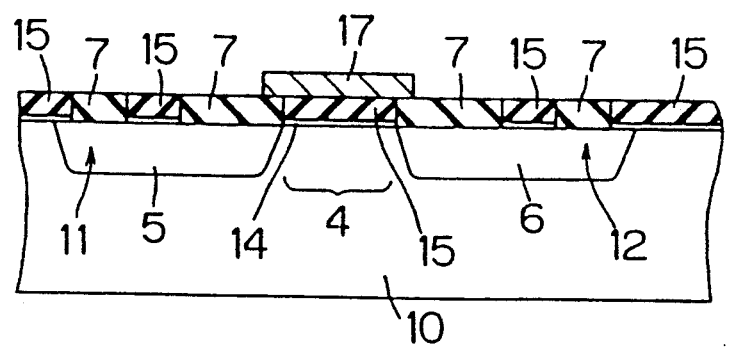
Figure 1:
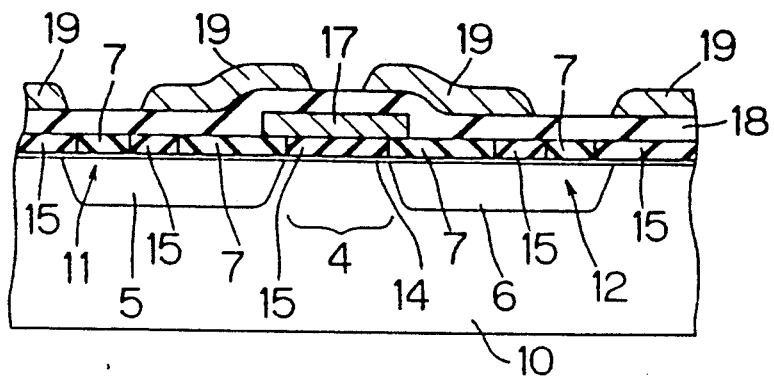
Figure 1:
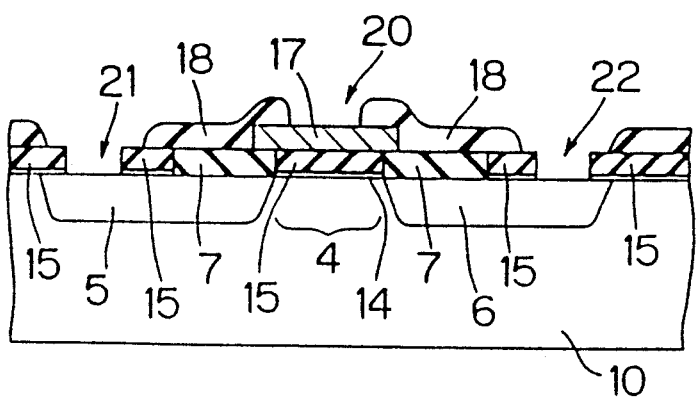
Figure 1:
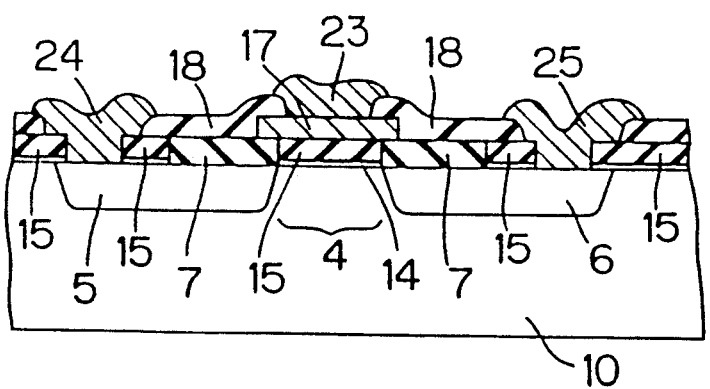

FIGS. 1(a)-1(i) are cross-sectional views showing the sequential steps of a method of manufacturing a semiconductor device having a ferroelectric film according to an embodiment of the present invention. As shown in FIG. 1 (a), a resist 3 having windows 1 and 2 respectively corresponding to a source region and a drain region is first patterned on the surface of a semiconductor substrate 10 such as a p-type silicon substrate. Arsenic ions, for example, are implanted using the resist 3 as a mask. Consequently, a source diffusion region 5 and a drain diffusion region 6 which are impurity diffusion regions are formed with a channel region 4 being interposed therebetween.

As shown in FIG. 1 (b), an oxide film 7 corresponding to an underlying film and serving as an insulation film is then formed on the entire surface of the substrate 10 by the CVD (Chemical Vapor Deposition) process. A resist 8 is patterned on the surface of this oxide film 7. This resist 8 has a window 9 above the channel region 4, and is further formed in at least a source electrode forming position 11 and a drain electrode forming position 12.

The oxide film 7 is then etched by reactive-ion etching using the resist 8 as a mask. In addition, the resist 8 is stripped. Consequently, the oxide film 7 is formed into the same pattern as that of the resist 8. That is, the oxide film 7 after the patterning has a window 13 above the channel region 4, and covers at least the source and drain forming positions 11 and 12, as shown in FIG. 1 (c). After the resist 8 is stripped, a thin gate oxide film 14 is formed by the thermal oxidation process.

In this state, a ferroelectric film 15 made of PZT or the like is formed by the sputtering process or the like so as to cover the entire surface of the substrate 10, as shown in Fig. 1 (d). In addition, a resist 16 is applied so as to flatten the surface of this ferroelectric film 15. A material having a low selection ratio to the ferroelectric film 15 in dry etching such as ion milling which is the first type of etching and having a high selection ratio to the ferroelectric film 15 in wet etching which is the second type of etching is applied to the above-mentioned oxide film 7. That is, when the ferroelectric film 15 is made of, for example, PZT, a silicon oxide film, for example, is applied to the oxide film 7.

After the surface of the ferroelectric film 15 is flattened by the resist 16, the resist 16 and the ferroelectric film 15 are etched back by the ion milling. This etch back is made until the oxide film 7 is exposed. Since the selection ratio of the resist 16 to the ferroelectric film 15 is low, the etch back proceeds uniformly over the entire surface of the substrate 10. In addition, since the selection ratio of the oxide film 7 to the ferroelectric film 15 in the dry etching is low, there is no possibility that this oxide film 7 is immediately etched away after the oxide film 7 is exposed. Consequently, the substrate 10 is not damaged due to the above-mentioned ion milling.

If the resist remaining on the substrate 10 is removed after the etch back is thus made, a state shown in FIG. 1 (e) occurs.

As shown in FIG. 1 (f), a gate electrode 17 made of platinum is then formed on the surface of the ferroelectric film 15 above the channel region 4.

As shown in FIG. 1 (g), an oxide film 18 covering the entire surface of the substrate 10 is then formed by, for example, the CVD process. A material having a high selection ratio to the ferroelectric film 15 in wet etching is applied to this oxide film 18, similarly to the oxide film 7. A resist 19 is patterned on the surface of the oxide film 18. The resist 19 respectively has openings in a position on the gate electrode 17 and the source and drain electrode forming positions 11 and 12.

When wet etching using, for example, hydrofluoric acid is made using the resist 19 as a mask. As a result, a gate contact hole 20 is formed in the position on the gate electrode 17. The oxide film 7 is etched in the source and drain electrode forming positions 11 and 12, subsequently to the etching of the oxide film 18. Consequently, a source contact hole 21 and a drain contact hole 22 for respectively exposing the source diffusion region 5 and the drain diffusion region 6 are formed. In such a manner, a state shown in FIG. 1 (h) occurs.

In this state, a wiring metal such as aluminum is deposited in the contact holes 20, 21 and 22, so that a gate wiring 23, a source electrode 24 and a drain electrode 25 are formed, as shown in FIG. 1 (i).

As described above, the selection ratios of the oxide films 7 and 18 to the ferroelectric substance 15 in wet etching are high. Accordingly, there is no possibility that the ferroelectric film 15 is etched in the case of the etching shown in FIG. 1 (h). Even when the pattern of the resist 19 shown in FIG. 1 (g) is not formed with high precision, therefore, it is possible to reliably form the contact holes 21 and 22 in desired positions with high precision. Consequently, the manufacturing processes can be simplified.

Furthermore, the oxide film 7 in the source and drain electrode forming positions 11 and 12 is selectively removed, leaving portions. Accordingly, the oxide film 7 in the remaining portions serves to insulate the gate electrode 17 from the source diffusion region 5 and the drain diffusion region 6.

As described in the foregoing, according to the present invention, the oxide film 7 having the window 13 above the channel region 4 in which the ferroelectric film 15 is to be formed is previously formed (see FIG. 1 (c)). The ferroelectric film 15 is formed over the whole surface (see FIG. 2 (d)). Thereafter, the ferroelectric film 15 is etched back until the oxide film 7 is exposed. Consequently, the ferroelectric film 15 is patterned in the above-mentioned window 13 (see FIG. 1 (e)). Since the oxide film 7 is formed into a fine pattern using the resist 8, the ferroelectric film 15 formed in the window 13 of the oxide film 7 having a fine pattern is also formed into a fine pattern. As a result of forming the ferroelectric film 15 into a fine pattern, the gate length can be decreased, thereby to make it possible to increase the integration density of the semiconductor device such as an EEPROM.

Moreover, the ion milling is applied in the case of the etch back. At this time, however, the surface of the substrate 10 is covered with the ferroelectric film 15 and the oxide film 7. Consequently, the substrate 10 is not damaged, so that the element formed on the substrate 10 can have good characteristics.

Additionally, it is possible to pattern the ferroelectric film 15 without repeating the patterning of a resist and etching, unlike the above-mentioned prior art, causing no degradation of patterning precision.

Although description was made of the embodiment of the present invention, the present invention is not limited to the above-mentioned embodiment. For example, in the abovementioned embodiment, the etching of the oxide films 7 and 18 in forming the contact holes 20, 21 and 22 is made by wet etching using hydrofluoric acid. However, such a method may be replaced with, for example, a method of selectively etching the oxide films 7 and 18 away by applying reactive-ion etching or the like under the condition that the oxide films 7 and 18 are easily etched and the ferroelectric film 15 is not easily etched.

Furthermore, although in the above-mentioned embodiment, description was made taking as an example a case where PZT is used as a ferroelectric substance, the present invention is easily applicable to a case where other ferroelectric substances such as PLZT, BaTiO$_3$, PbTiO$_3$, LiNbO$_3$, BaMgF$_4$ and the like are used.

Additionally, although in the above-mentioned embodiment, description was made taking as an example a case where the field effect transistor using the ferroelectric film 15 as a gate insulation film is formed on the semiconductor substrate 10, the present invention is widely applicable to a device which can be produced by patterning a ferroelectric film on the surface of an arbitrary substrate.

Although the present invention has been described and illustrated in detail, it is clearly understood that the same is by way of illustration and example only and is not to be taken by way of limitation, the spirit and scope of the present invention being limited only by the terms of the appended claims

What is claimed is:

1. A method of manufacturing a device having a ferroelectric film, comprising the steps of:
   patterning on a substrate an underlying film, which is made of a material having a low selection ratio to said ferroelectric film in the first type of etching and having a high selection ratio to said ferroelectric film in the second type of etching, having a window in a region where said ferroelectric film is to be formed;
   forming said ferroelectric film so as to cover the surface of the substrate on which said underlying film is formed;
   forming a resist so as to flatten the surface of the ferroelectric film;
   etching back said resist and said ferroelectric film by said first type of etching until said underlying film is exposed; and
   removing said underlying film by said second type of etching.

2. The method according to claim 1, wherein said ferroelectric film is PZT, and said underlying film is a silicon oxide film.

3. The method according to claim 2, wherein said second type of etching is reactive-ion etching made under the conditions so set that the silicon oxide film is etched more easily than the PZT.

4. The method according to claim 2, wherein said first type of etching is dry etching.

5. The method according to claim 4, wherein said dry etching is ion milling.

6. The method according to claim 2, wherein said second type of etching is wet etching.

7. The method according to claim 6, wherein hydrofluoric acid is used for said wet etching.

8. A method of manufacturing a semiconductor device having a ferroelectric film, comprising the steps of:
   forming impurity diffusion regions serving as a source and a drain on the surface of a semiconductor substrate so that the area between the impurity diffusion regions is a channel region;
   patterning on said semiconductor substrate an insulation film made of a material having a low selection ratio to said ferroelectric film in the first type of etching and having a high selection ratio to said ferroelectric film in the second type of etching so as to have a window above the channel region as well as to cover at least a source electrode forming position and a drain electrode forming position;
   forming said ferroelectric film so as to cover the surface of the semiconductor substrate on which said insulation film is formed;
   forming a resist so as to flatten the surface of the ferroelectric film;
   etching back said resist and said ferroelectric film by said first type of etching until said insulation film is exposed;
   forming a gate electrode on the surface of the ferroelectric film above said channel region;
   selectively removing the insulation film in said source electrode forming position and said drain electrode forming position by said second type of etching to form a source contact hole and a drain contact hole;
   forming a source electrode in said source contact hole; and
   forming a drain electrode in said drain contact hole.

9. The method according to claim 8, wherein in said step of selectively removing the insulation film in said source electrode forming position and said drain electrode forming position, the insulation film in portions between the gate electrode and the impurity diffusion regions is left.

10. The method according to claim 8, wherein said ferroelectric film is PZT, and said underlying film is a silicon oxide film.

11. The method according to claim 10, wherein said second type of etching is reactive-ion etching made under the conditions so set that the silicon oxide film is etched more easily than the PZT.

12. The method according to claim 10, wherein said first type of etching is dry etching.

13. The method according to claim 12, wherein said dry etching is ion milling.

14. The method according to claim 10, wherein said second type of etching is wet etching.

15. The method according to claim 14, wherein hydrofluoric acid is used for said wet etching.

* * * * *